United States Patent
Ryo et al.

(10) Patent No.: US 10,418,445 B2
(45) Date of Patent: Sep. 17, 2019

(54) SILICON CARBIDE SEMICONDUCTOR DEVICE AND METHOD OF MANUFACTURING A SILICON CARBIDE SEMICONDUCTOR DEVICE

(71) Applicant: FUJI ELECTRIC CO., LTD., Kawasaki-shi, Kanagawa (JP)

(72) Inventors: Mina Ryo, Matsumoto (JP); Takeshi Tawara, Tsukuba (JP); Masaki Miyazato, Matsumoto (JP); Masaaki Miyajima, Matsumoto (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 0 days.

(21) Appl. No.: 15/988,764

(22) Filed: May 24, 2018

(65) Prior Publication Data

US 2018/0358444 A1    Dec. 13, 2018

(30) Foreign Application Priority Data

Jun. 9, 2017    (JP) .................... 2017-114768

(51) Int. Cl.
*H01L 29/16*    (2006.01)
*H01L 29/66*    (2006.01)
*H01L 29/78*    (2006.01)

(52) U.S. Cl.
CPC .... *H01L 29/1608* (2013.01); *H01L 29/66068* (2013.01); *H01L 29/7813* (2013.01)

(58) Field of Classification Search
CPC ................... H01L 29/1608; H01L 29/7813
See application file for complete search history.

(56) References Cited

U.S. PATENT DOCUMENTS

2015/0162406 A1* 6/2015 Laven ................. H01L 29/0696
257/335

FOREIGN PATENT DOCUMENTS

JP    2005-276953 A    10/2005
JP    2009-164440 A    7/2009

* cited by examiner

*Primary Examiner* — Daniel P Shook
(74) *Attorney, Agent, or Firm* — Rabin & Berdo, P.C.

(57) ABSTRACT

In a vertical MOSFET having a trench gate structure, a lifetime killer region is provided in a p-type epitaxial layer formed by epitaxial growth. The lifetime killer region includes an electron lifetime killer that causes electrons entering the lifetime killer region to recombine and become extinct. As a result, the lifetime killer region decreases the electrons generated at the pn interface of the p-type epitaxial layer and an n-type drift layer and enables a configuration in which electrons are not delivered to the p-type epitaxial layer.

8 Claims, 13 Drawing Sheets

SILICON CARBIDE SEMICONDUCTOR DEVICE AND METHOD OF MANUFACTURING A SILICON CARBIDE SEMICONDUCTOR DEVICE

CROSS REFERENCE TO RELATED APPLICATIONS

This application is based upon and claims the benefit of priority of the prior Japanese Patent Application No. 2017-114768 filed on Jun. 9, 2017, the entire contents of which are incorporated herein by reference.

BACKGROUND OF THE INVENTION

1. Field of the Invention

Embodiments of the invention relate to a silicon carbide semiconductor device and a method of manufacturing a silicon carbide semiconductor device.

2. Description of the Related Art

Silicon carbide semiconductors using silicon carbide (SiC) as a material are expected to be next generation semiconductor elements that replace those using silicon (Si). Compared to conventional semiconductor elements that use silicon, silicon carbide semiconductors have advantages such as lowering the resistance of the device in the ON state to several hundredths of that of a conventional semiconductor element and use in environments of higher temperatures (i.e., 200 degrees C. or higher). These differences are consequences of the characteristics of the material itself. For example, silicon carbide has a bandgap that is about 3 times larger than that of silicon and a dielectric breakdown field strength that is nearly 10 times higher than that of silicon.

Further, silicon carbide devices that have become commercial products include Schottky barrier diodes (SBDs), planar-type vertical metal-oxide-semiconductor field-effect-transistors (MOSFETs) and trench-type MOSFETs.

A trench-type MOSFET is a device having a 3-dimensional structure in which a MOS gate (insulated gate using a metal oxide film semiconductor) is embedded in a trench (groove) formed in a semiconductor base (hereinafter, silicon carbide base) containing silicon carbide and a sidewall of the trench is used as a channel. Therefore, when elements having the same ON resistance (Ron) are compared, a trench type structure may have a smaller element area than that of a planar gate structure having a MOS gate provided in a flat plate shape on a silicon carbide base and, thus, is considered to be a promising device structure.

A structure of a conventional silicon carbide semiconductor device will be described taking a vertical MOSFET having a trench gate structure has an example. FIG. 13 is a cross-sectional view of a structure of a conventional silicon carbide semiconductor device. The conventional silicon carbide semiconductor device depicted in FIG. 13 includes in an upper portion (portion including at least a front surface and a $p^+$-type base region 104) of a semiconductor base (hereinafter, silicon carbide base) 200 containing silicon carbide, a MOS gate having an ordinary trench gate structure. The silicon carbide base (semiconductor chip) 200 is formed by sequentially forming on an $n^+$-type supporting substrate (hereinafter, $n^+$-type silicon carbide substrate) 101 containing silicon carbide, an n-type drift layer 102 and silicon carbide layers constituting an $n^+$-type drift region 105, which is a current diffusion region, and a p-type epitaxial layer 106.

In the $n^+$-type drift region 105, a $p^+$-type region 103 is selectively provided so as to cover a bottom of a trench 1018 entirely. The $p^+$-type region 103 is provided at a depth not reaching the n-type drift layer 102. Further, in the $n^+$-type drift region 105, between (mesa part) adjacent trenches 1018, the $p^+$-type base region 104 is selectively provided. The $p^+$-type base region 104 is in contact with the p-type epitaxial layer 106 and is provided at a depth not reaching the n-type drift layer 102. Reference numerals 107, 108, 109, 1010, 1011, 1012, 1013, and 1014 are an $n^{++}$-type source region, a $p^{++}$-type contact region, a gate insulating film, a gate electrode, an interlayer insulating film, a barrier metal, a source electrode, and a source electrode pad, respectively.

Such a vertical MOSFET having a trench gate structure has, as a body diode between a source and a drain, an intrinsic parasitic pn diode formed by the p-type epitaxial layer 106 and the n-type drift layer 102. In FIG. 13, a portion 19 surrounded by a dashed line is a body diode region.

When the body diode is energized, holes generated at a pn interface of the p-type epitaxial layer 106 and the n-type drift layer 102 flow along the n-type drift layer 102 toward the $n^+$-type silicon carbide substrate 101 and recombine around dislocations present at an interface of the $n^+$-type silicon carbide substrate 101 and the n-type drift layer 102, whereby stacking faults, which cause degradation of forward voltage Vf, are generated.

Therefore, according to one technique, a minority carrier recombination layer (not depicted) is provided between the $n^+$-type silicon carbide substrate 101 and the n-type drift layer 102. As a recombination layer, a silicon carbide epitaxial layer doped with, for example, nitrogen (N) at a high concentration is known. Due to provision of the recombination layer, holes generated at the pn interface recombine in the recombination layer and are prevented from reaching the $n^+$-type silicon carbide substrate 101, whereby the generation of stacking faults from the $n^+$-type silicon carbide substrate 101 may be prevented.

As a technique to prevent recombination, for example, a silicon carbide semiconductor device includes a recombination region in which recombination centers are introduced. The recombination region is formed in a drift layer. The recombination region, at a PN interface that is a junction interface of a drift layer and a base region, is formed only on a path along which current flows immediately after forward current energization starts, for example, refer to Japanese Laid-Open Patent Publication No. 2009-164440. Further, according to a bipolar SiC semiconductor device, to perform carrier lifetime control with an aim to reduce recovery current or tail current, an impurity is irradiated in a first layer or a second layer by an ion implantation method, defects are introduced into the first layer or the second layer, and the defects function as carrier recombine centers, for example, refer to Japanese Laid-Open Patent Publication No. 2005-276953.

SUMMARY OF THE INVENTION

According to an embodiment of the present invention a silicon carbide semiconductor device includes a first semiconductor layer of a first conductivity type provided on a front surface of a silicon carbide substrate; a second semiconductor layer of a second conductivity type provided on a first side of the first semiconductor layer opposite a second side of the first semiconductor layer facing the silicon carbide substrate; a first semiconductor region of the second conductivity type selectively provided in the second semiconductor layer, the first semiconductor region controlling electron lifetime; a second semiconductor region of the first conductivity type selectively provided in the second semiconductor layer at a position shallower than a position of the first semiconductor region, the second semiconductor region having an impurity concentration that is higher than an impurity concentration of the silicon carbide substrate; a third semiconductor region of the second conductivity type selectively provided in the second semiconductor layer at a position shallower than the position of the first semiconductor region, the third semiconductor region having an impurity concentration that is higher than an impurity concentration of the second semiconductor layer; a trench penetrating the second semiconductor region and the second semiconductor layer, and reaching the first semiconductor layer; a gate electrode provided in the trench, via a gate insulating film; a first electrode in contact with the second semiconductor region and the third semiconductor region; and a second electrode provided at a rear surface of the silicon carbide substrate.

In the embodiment, the first semiconductor region is provided separated from the trench.

In the embodiment, the first semiconductor region has crystal defects at a density higher than a density of crystal defects in the second semiconductor layer.

In the embodiment, the first semiconductor region is a region implanted with an element that creates a deep energy level.

According to another embodiment of the present invention, a method of manufacturing a silicon carbide semiconductor device, includes forming a first semiconductor layer of a first conductivity type on a front surface of a silicon carbide substrate; forming a second semiconductor layer of a second conductivity type on the first semiconductor layer; selectively forming a first semiconductor region of the second conductivity type in the second semiconductor layer, the first semiconductor region controlling electron lifetime; selectively forming a second semiconductor region of the first conductivity type in the second semiconductor layer, at a position shallower than a position of the first semiconductor region, the second semiconductor region having an impurity concentration that is higher than an impurity concentration of the silicon carbide substrate; selectively forming a third semiconductor region of the second conductivity type in the second semiconductor layer, at a position shallower than the position of the first semiconductor region, the third semiconductor region having an impurity concentration that is higher than an impurity concentration of the second semiconductor layer; forming a trench that penetrates the second semiconductor region and the second semiconductor layer, and reaches the first semiconductor layer; forming a gate electrode in the trench, via a gate insulating film; forming a first electrode in contact with the second semiconductor region and the third semiconductor region; and forming a second electrode at a rear surface of the silicon carbide substrate.

In the embodiment, selectively forming the first semiconductor region includes forming the first semiconductor region separated from the trench.

In the embodiment, selectively forming the first semiconductor region includes forming the first semiconductor region to have a crystal defect density that is higher than a crystal defect density of the second semiconductor layer.

In the embodiment, selectively forming the first semiconductor region includes forming the first semiconductor region by implanting an element that creates a deep energy level.

Objects, features, and advantages of the present invention are specifically set forth in or will become apparent from the following detailed description of the invention when read in conjunction with the accompanying drawings.

DETAILED DESCRIPTION OF THE INVENTION

Figure 1:
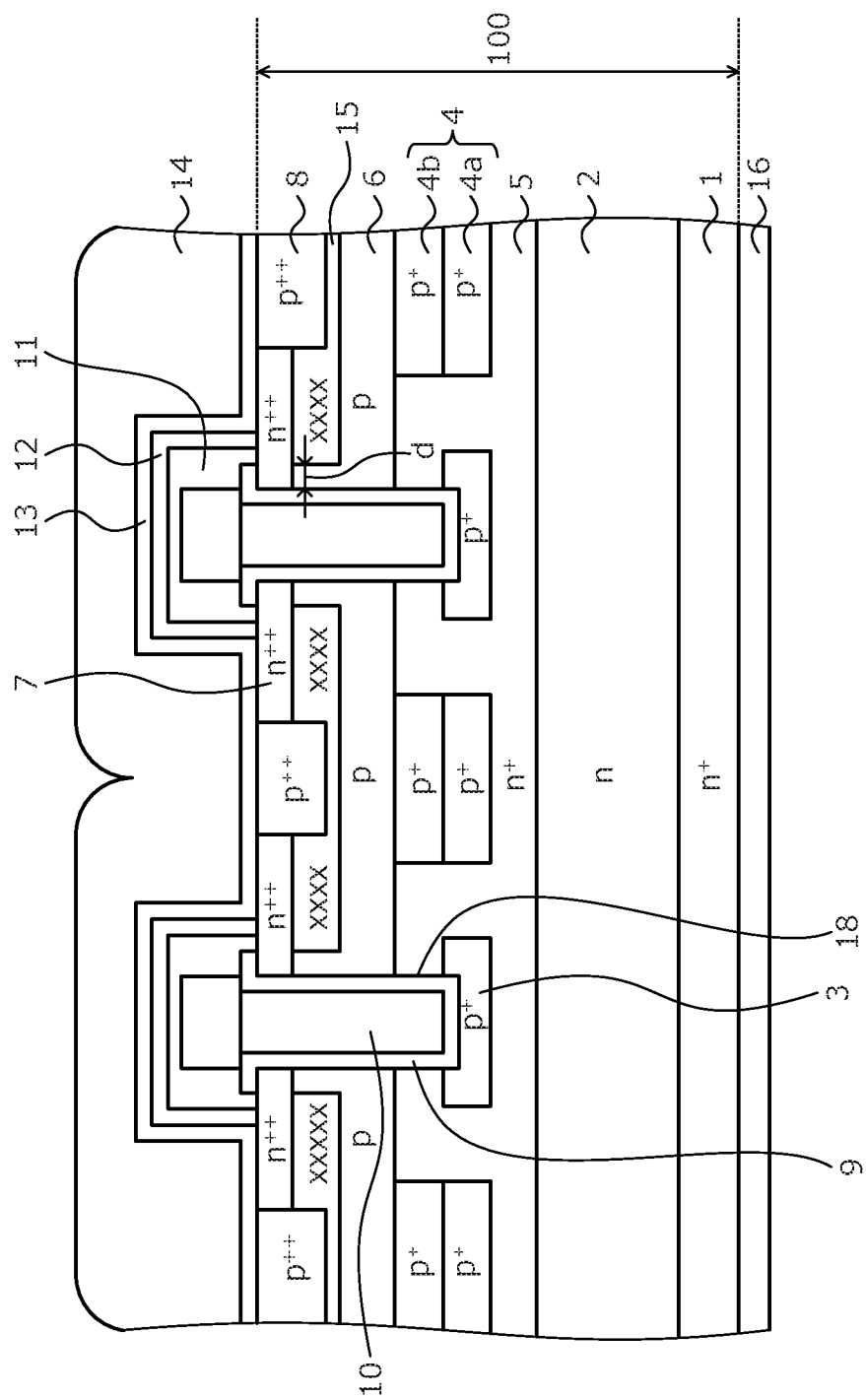
FIG. 1 is a cross-sectional view of a silicon carbide semiconductor device according to a first embodiment.

First, problems associated with the related arts will be described. With the conventional structure described, electrons generated at the pn interface are transferred to the p-type epitaxial layer 106, recombine around surface defects, process damage and dislocations present at a surface of the p-type epitaxial layer 106, and thus, the generation of stacking faults cannot be prevented because when the p-type epitaxial layer 106 uses aluminum (Al) as a p-type impurity and an impurity concentration is about $4 \times 10^{17}/cm^3$, a lifetime of electrons in the p-type epitaxial layer 106 is long and therefore, the electrons cannot be sufficiently decreased, whereby the electrons are delivered to the surface of the p-type epitaxial layer 106. A problem arises in that due to the generation of these stacking faults, forward voltage of the silicon carbide semiconductor device increases.

Embodiments of a silicon carbide semiconductor device and method of manufacturing a silicon carbide semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical will be given the same reference numerals and will not be repeatedly described.

A semiconductor device according to the present invention is configured using a semiconductor material (hereinafter, wide bandgap semiconductor material) having a bandgap that is wider than that of silicon. Here, description will be given taking, as an example, a structure of a semiconductor device (silicon carbide semiconductor device) using, for example, silicon carbide (SiC) as a wide bandgap semiconductor material. FIG. 1 is a cross-sectional view of the silicon carbide semiconductor device according to a first embodiment. In FIG. 1, only 2 unit cells (functional units of an element) are depicted and other unit cells adjacent to these are not depicted (similarly in FIGS. 9 and 11). The silicon carbide semiconductor device according to the first embodiment and depicted in FIG. 1 is a MOSFET having a MOS gate in an upper portion (portion including at least a front surface and a p$^+$-type base region 4) of a semiconductor base (silicon carbide base: semiconductor chip) 100 containing silicon carbide.

The silicon carbide base 100 is formed by sequentially forming epitaxial growth on an n$^+$-type supporting substrate (n$^+$-type silicon carbide substrate) 1 containing silicon carbide, silicon carbide layers constituting an n-type drift layer (first semiconductor layer) 2 and a p-type epitaxial layer (second semiconductor layer) 6. The MOS gate is configured by the p-type epitaxial layer 6, an n$^{++}$-type source region (second semiconductor region) 7, a p$^{++}$-type contact region (third semiconductor region) 8, a trench 18, a gate insulating film 9, and a gate electrode 10. In particular, in a surface layer on a source side (side toward a source electrode 13) of the n-type drift layer 2, an n$^+$-type region (hereinafter, n$^+$-type drift region) 5 is provided so as to be in contact with the p-type epitaxial layer 6. The n$^+$-type drift region 5 is a so-called current spreading layer (CSL) that reduces carrier spread resistance. The n$^+$-type drift region 5, for example, is provided uniformly along a direction (hereinafter, a lateral direction) parallel to a base front surface (front surface of the silicon carbide base 100).

In the n$^+$-type drift region 5, a p$^+$-type region 3 and the p$^+$-type base region 4 are each selectively provided. The p$^+$-type region 3 is provided so as to cover a bottom and a bottom corner part of the trench 18. The bottom corner part of the trench 18 is a boundary of the bottom and a sidewall of the trench 18. The p$^+$-type region 3 is provided from a position deeper toward a drain than is an interface of the p-type epitaxial layer 6 and the n$^+$-type drift region 5 to a depth not reaching an interface of the n$^+$-type drift region 5 and the n-type drift layer 2. Provision of the p$^+$-type region 3 enables a pn junction between the p$^+$-type region 3 and the n$^+$-type drift region 5 to be formed near the bottom of the trench 18. The p$^+$-type region 3 has an impurity concentration that is higher than an impurity concentration of the p-type epitaxial layer 6.

The p$^+$-type base region 4 is provided between (mesa part) the trench 18 and an adjacent trench 18, and is separated from the p$^+$-type region 3 and is in contact with the p-type epitaxial layer 6. The p$^+$-type base region 4 may partially extend toward the trenches 18 to be in contact with the p$^+$-type regions 3. Further, the p$^+$-type base region 4 is provided from the interface of the p-type epitaxial layer 6 and the n$^+$-type drift region 5 to a depth not reaching the interface of the n$^+$-type drift region 5 and the n-type drift layer 2. Provision of the p$^+$-type base region 4 enables a pn junction between the p$^+$-type base region 4 and the n$^+$-type drift region 5 to be formed between the trenches 18, at a position deeper toward the drain than are the bottoms of the trenches 18. Formation of pn junctions of the p$^+$-type region 3 and the p$^+$-type base region 4 with the n$^+$-type drift region 5 in this manner enables an application of high electric field to a part of the gate insulating film 9 at the bottom of the trench 18 to be prevented. Reference characters 4a, 4b indicate a part (hereinafter, lower p$^+$-type base region) of the p$^+$-type base region 4 deeper toward the drain than is the p-type epitaxial layer 6 and a part (hereinafter, upper p$^+$-type base region) of the p$^+$-type base region 4 toward a source, respectively. The upper and the lower p$^+$-type base regions 4a, 4b have impurity concentrations higher than the impurity concentration of the p-type epitaxial layer 6.

In the p-type epitaxial layer 6, the n$^{++}$-type source region 7, the p$^{++}$-type contact region 8, and a lifetime killer region 15 are each selectively formed so as to be in contact with each other. A depth of the p$^{++}$-type contact region 8, for example, may be deeper than the n$^{++}$-type source region 7. The lifetime killer region 15 is provided at a position deeper than the p$^{++}$-type contact region 8 and the n$^{++}$-type source region 7.

The lifetime killer region 15 is in contact with the n$^{++}$-type source region 7 and the p$^{++}$-type contact region 8 and is provided on a drain side of the n$^{++}$-type source region 7 and the p$^{++}$-type contact region 8. Further, the lifetime killer region 15 is provided uniformly along, for example, the lateral direction so as not to include parts of the p-type epitaxial layer 6 forming a channel. The parts of the p-type epitaxial layer 6 forming a channel are parts along sidewalls of the trenches 18. In other words, each lifetime killer region 15 is provided a certain distance d, for example, 0.5 µm, from the sidewalls of the trenches 18. This is to prevent shape defects of the trenches 18 due to variations in an etching rate and an oxidation rate at the time of formation of the lifetime killer regions 15.

Here, the lifetime killer regions 15 are regions that control electron lifetime. In particular, the lifetime killer regions 15 are regions into which an electron lifetime killer is introduced, whereby electrons entering the lifetime killer regions 15 recombine and become extinct, thereby shortening the electron lifetime. As a result, the lifetime killer regions 15 decrease the electrons generated at the pn interface of the p-type epitaxial layer 6 and the n-type drift layer 2, enabling a configuration in which electrons are not delivered to a surface of the p-type epitaxial layer 6.

Further, the lifetime killer regions 15 may have a film thickness from 0.05 to 0.5 µm. When the film thickness is thinner than 0.05 µm, electron density cannot be sufficiently attenuated and electrons are delivered to the surface of the p-type epitaxial layer 6. With ordinary ion implantation equipment, implantation of a lifetime killer to a depth of 0.5 µm or deeper is difficult.

In the first embodiment, a lifetime killer is introduced by damaging the crystal structure by ion implantation. In FIG. 1, × depicts an example of damaged inflicted to the crystal structure. In particular, damage inflicted to the crystal structure is a crystal defect, and a density of crystal defects in the lifetime killer regions 15 is higher than a density of crystal defects in the p-type epitaxial layer 6. The crystal defects may be formed by, for example, implantation of an element that easily forms crystal defects, argon (Ar), etc. Further, the crystal defects may be formed by implantation of protons (p).

In a case where the lifetime killer regions 15 are formed by implantation of Ar, an Ar implantation concentration may be from $1 \times 10^{14}$ to $1 \times 10^{21}$/cm$^3$. When the Ar implantation concentration is lower than $1 \times 10^{14}$/cm$^3$, the electron density cannot be sufficiently attenuated and electrons are delivered to the surface of the p-type epitaxial layer 6. Further, when the Ar implantation concentration is higher than $1 \times 10^{21}$/cm$^3$, crystal properties of the p-type epitaxial layer 6 become poor, ON resistance of the silicon carbide semiconductor device increases, and performance degrades.

The trenches 18 penetrate the $n^{++}$-type source regions 7 and the p-type epitaxial layer 6 from the base front surface and reach the $n^+$-type drift region 5. In each of the trenches 18, the gate insulating film 9 is provided along the sidewalls of the trench 18 and the gate electrode 10 is provided on the gate insulating film 9. An end of the gate electrode 10 toward the source may or may not protrude outwardly from the base front surface. The gate electrode 10 is electrically connected at a non-depicted part to a gate pad (not depicted). An interlayer insulating film 11 is provided at the base front surface overall so as to cover the gate electrodes 10 embedded in the trenches 18.

A source electrode (first electrode) 13 is in contact with the $n^{++}$-type source regions 7 and the $p^{++}$-type contact regions 8 via contact holes opened in the interlayer insulating film 11, and is electrically insulated from the gate electrodes 10 by the interlayer insulating film 11. Between the source electrode 13 and the interlayer insulating film 11, for example, a barrier metal 12 that prevents diffusion of metal atoms from the source electrode 13 toward the gate electrodes 10 is provided. On the source electrode 13, a source electrode pad 14 is provided. At a rear surface (rear surface of the $n^+$-type silicon carbide substrate 1 constituting an $n^+$-type drain region) of the silicon carbide base 100, a drain electrode (second electrode) 16 is provided.

Figure 2:
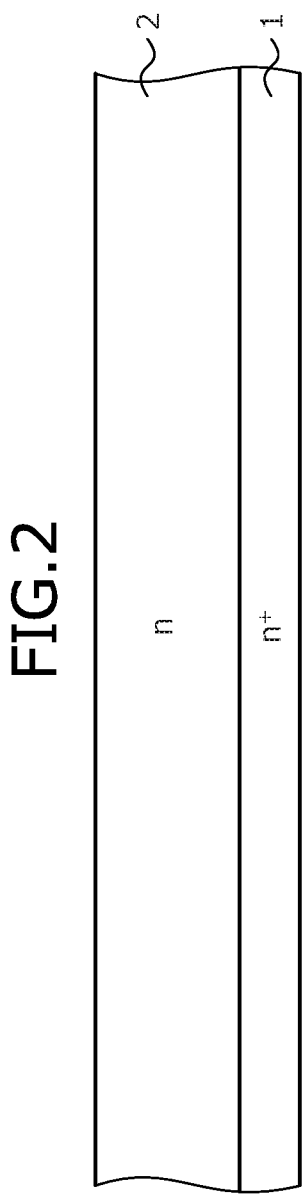
FIG. 2 is a cross-sectional view of the silicon carbide semiconductor device according to the first embodiment during manufacture.

A method of manufacturing the silicon carbide semiconductor device according to the first embodiment will be described. FIGS. 2, 3, 4, 5, 6, 7, and 8 are cross-sectional views of the silicon carbide semiconductor device according to the first embodiment during manufacture. First, the $n^+$-type silicon carbide substrate 1 constituting the $n^+$-type drain region is prepared. Next, on the front surface of the $n^+$-type silicon carbide substrate 1, the n-type drift layer 2 is formed by epitaxial growth. For example, conditions of the epitaxial growth for forming the n-type drift layer 2 may be set so that an impurity concentration of the n-type drift layer 2 becomes about $3 \times 10^{15}$/cm$^3$. The state up to here is depicted in FIG. 2.

Figure 3:
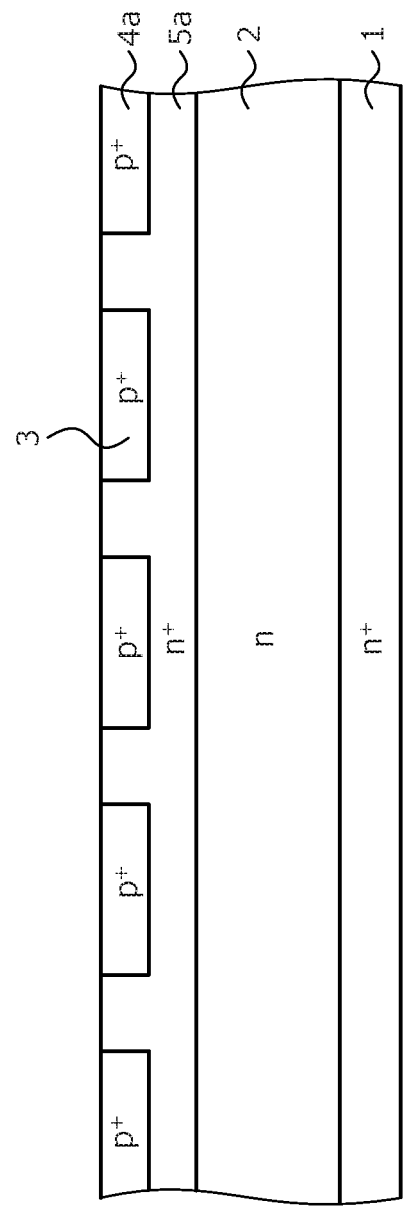
FIG. 3 is a cross-sectional view of the silicon carbide semiconductor device according to the first embodiment during manufacture.

Next, on the n-type drift layer 2, a first $n^+$-type drift region 5a is formed by epitaxial growth. For example, conditions of the epitaxial growth for forming the first $n^+$-type drift region 5a may be set so that an impurity concentration of the first $n^+$-type drift region 5a becomes about $1 \times 10^{17}$/cm$^3$. The first $n^+$-type drift region 5a is a portion of the $n^+$-type drift region 5. Next, in a surface layer of the first $n^+$-type drift region 5a, the $p^+$-type region 3 and the lower $p^+$-type base region 4a are each selectively formed by photolithography and ion implantation of a p-type impurity, the lower $p^+$-type base region 4a being a portion of the $p^+$-type base region 4. For example, a dose amount of the ion implantation for forming the $p^+$-type regions 3 and the lower $p^+$-type base regions 4a may be set so that impurity concentrations thereof become about $5 \times 10^{18}$/cm$^3$. The state up to here is depicted in FIG. 3.

Figure 4:
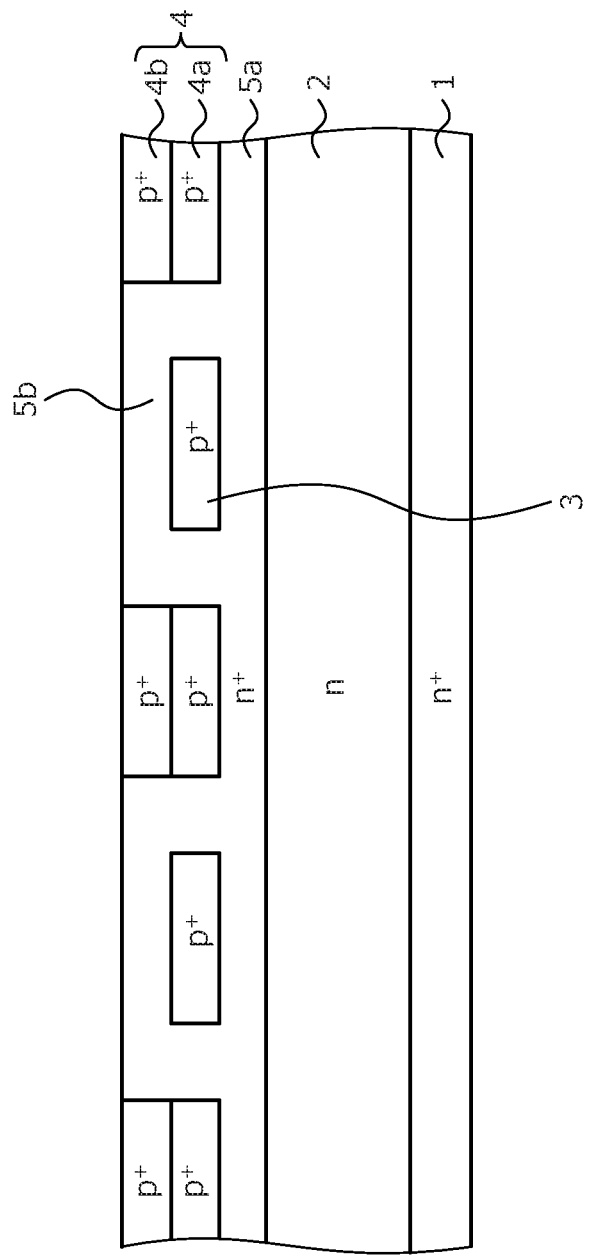
FIG. 4 is a cross-sectional view of the silicon carbide semiconductor device according to the first embodiment during manufacture.

Next, on the first $n^+$-type drift region 5a, the $p^+$-type regions 3 and the lower $p^+$-type base regions 4a, a second $n^+$-type drift region 5b is formed by epitaxial growth. For example, conditions of the epitaxial growth for forming the second $n^+$-type drift region 5b may be set so that an impurity concentration of the second $n^+$-type drift region 5b becomes about equal to an impurity concentration of the first $n^+$-type drift region 5a. The second $n^+$-type drift region 5b is a portion of the $n^+$-type drift region 5. The first $n^+$-type drift region 5a and the second $n^+$-type drift region 5b together form the $n^+$-type drift region 5. Next, the upper $p^+$-type base region 4b is selectively formed in a surface layer of the second $n^+$-type drift region 5b by photolithography and ion implantation of a p-type impurity. For example, a dose amount of the ion implantation for forming the upper $p^+$-type base regions 4b may be set so that an impurity concentration thereof becomes about equal to the impurity concentrations of the $p^+$-type regions 3 and the lower $p^+$-type base regions 4a. Each of the upper $p^+$-type base regions 4b is a portion of one $p^+$-type base region 4, i.e., one lower $p^+$-type base region 4a and one upper $p^+$-type base region 4b together form one $p^+$-type base region 4. The state up to here is depicted in FIG. 4.

Figure 5:
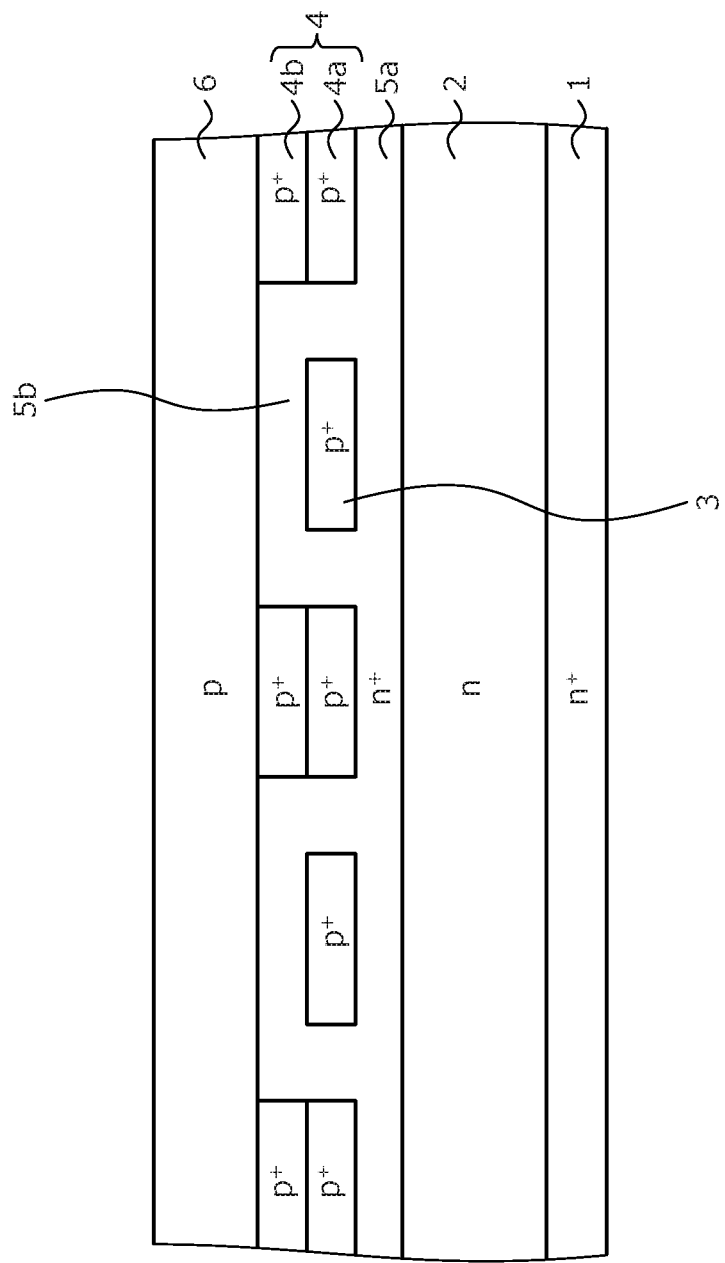
FIG. 5 is a cross-sectional view of the silicon carbide semiconductor device according to the first embodiment during manufacture.

Next, on the second $n^+$-type drift region 5b and the upper $p^+$-type base regions 4b, the p-type epitaxial layer 6 is formed by epitaxial growth. For example, conditions of the epitaxial growth for forming the p-type epitaxial layer 6 may be set so that the impurity concentration of the p-type epitaxial layer 6 becomes about $4 \times 10^{17}$/cm$^3$. The state up to here is depicted in FIG. 5.

Figure 6:
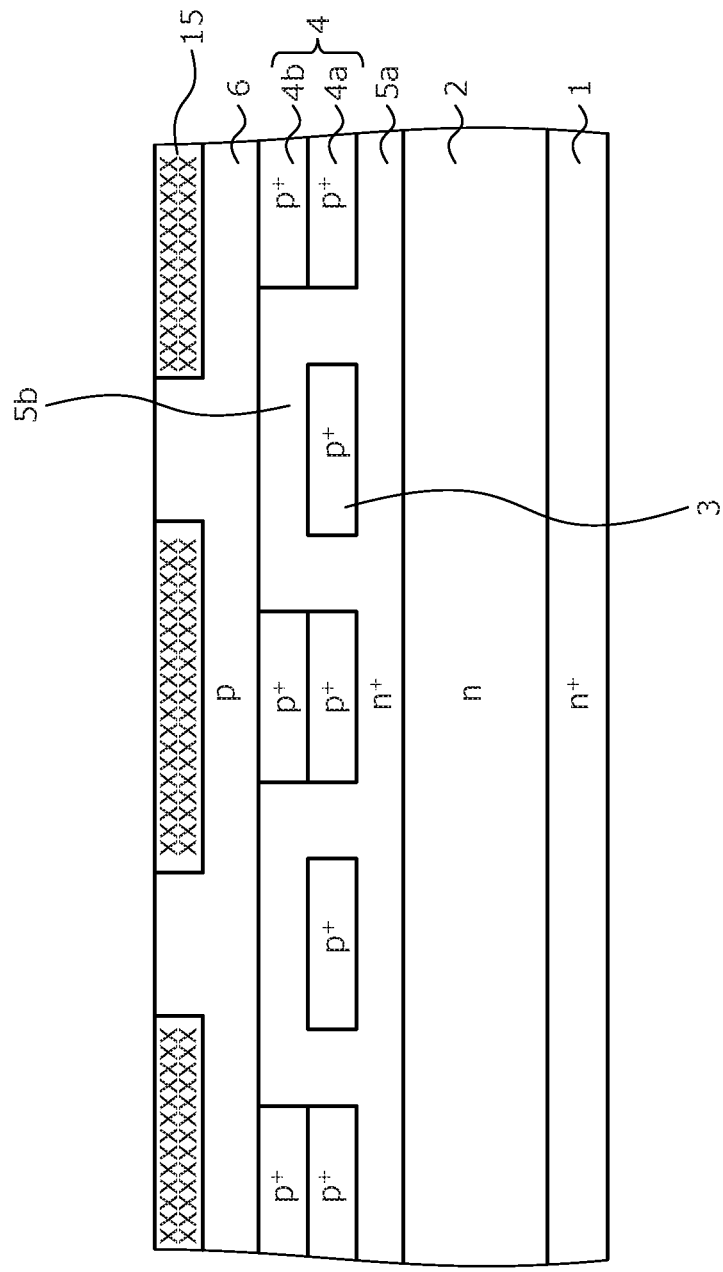
FIG. 6 is a cross-sectional view of the silicon carbide semiconductor device according to the first embodiment during manufacture.

Next, the lifetime killer regions 15 are formed in a surface layer of the p-type epitaxial layer 6 by photolithography and ion implantation of an element that easily damages the crystal structure, for example, by ion implantation of Ar. Here, a mask at the time of the photolithography is formed at parts where the trenches 18 are formed and parts along the sidewalls of the trenches 18, whereby the lifetime killer regions 15 are formed so as to not include the parts of the p-type epitaxial layer 6 where the trenches 18 are formed and where a channel is formed. In FIG. 6, × indicates an example of damage inflicted in the crystal structure. The state up to here is depicted in FIG. 6.

Figure 7:
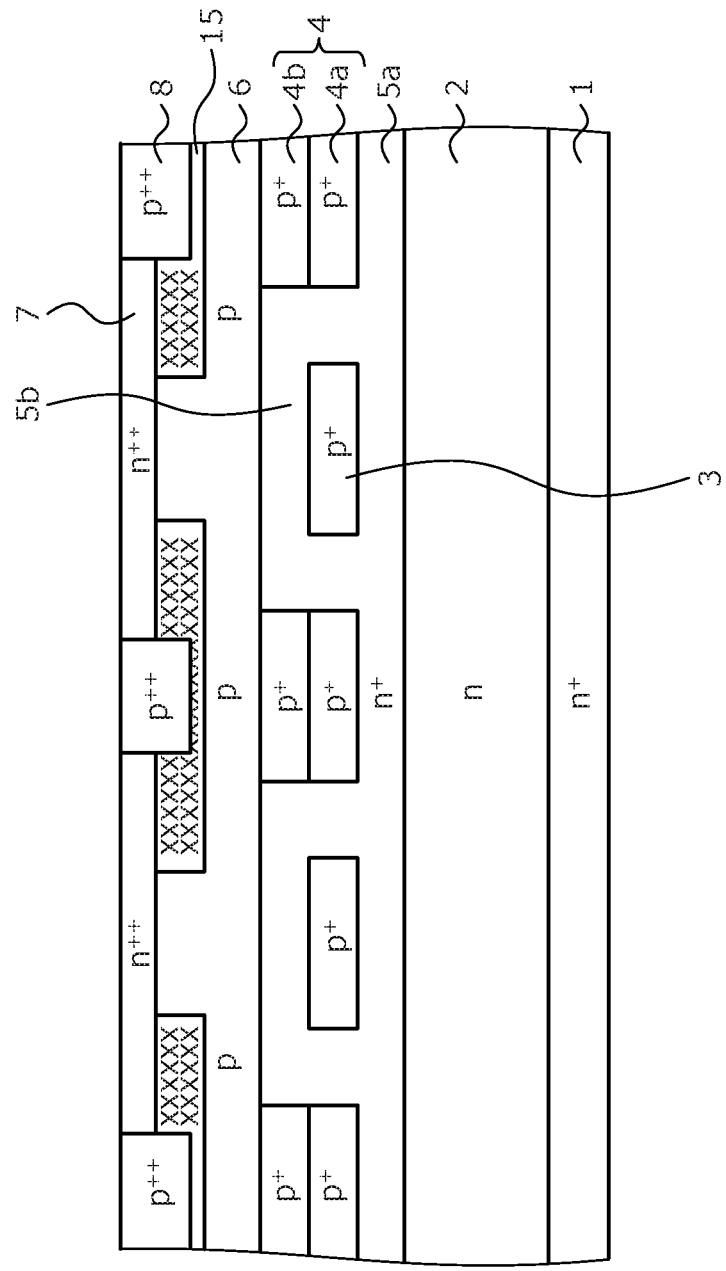
FIG. 7 is a cross-sectional view of the silicon carbide semiconductor device according to the first embodiment during manufacture.

Next, by photolithography and ion implantation of an n-type impurity, the $n^{++}$-type source region 7 is selectively formed in surface layers of the p-type epitaxial layer 6 and the lifetime killer regions 15. For example, a dose amount of the ion implantation for forming the $n^{++}$-type source regions 7 may be set so that an impurity concentration thereof becomes about $3 \times 10^{20}$/cm$^3$. Next, by photolithography and ion implantation of a p-type impurity, in the surface layers of the p-type epitaxial layer 6 and the lifetime killer regions 15, the $p^{++}$-type contact regions 8 are selectively provided so as to be in contact with the $n^{++}$-type source regions 7. For example, a dose amount of the ion implantation for forming the $p^{++}$-type contact regions 8 may be set so that an impurity concentration thereof becomes about $3 \times 10^{20}$/cm$^3$. A sequence in which the $n^{++}$-type source regions 7 and the $p^{++}$-type contact regions 8 are formed may be interchanged. Here, the $n^{++}$-type source regions 7 and the $p^{++}$-type contact regions 8 are formed at depths so as to not penetrate through the lifetime killer regions 15. After all ion implantations are completed, activation annealing is performed. The state up to here is depicted in FIG. 7.

Figure 8:
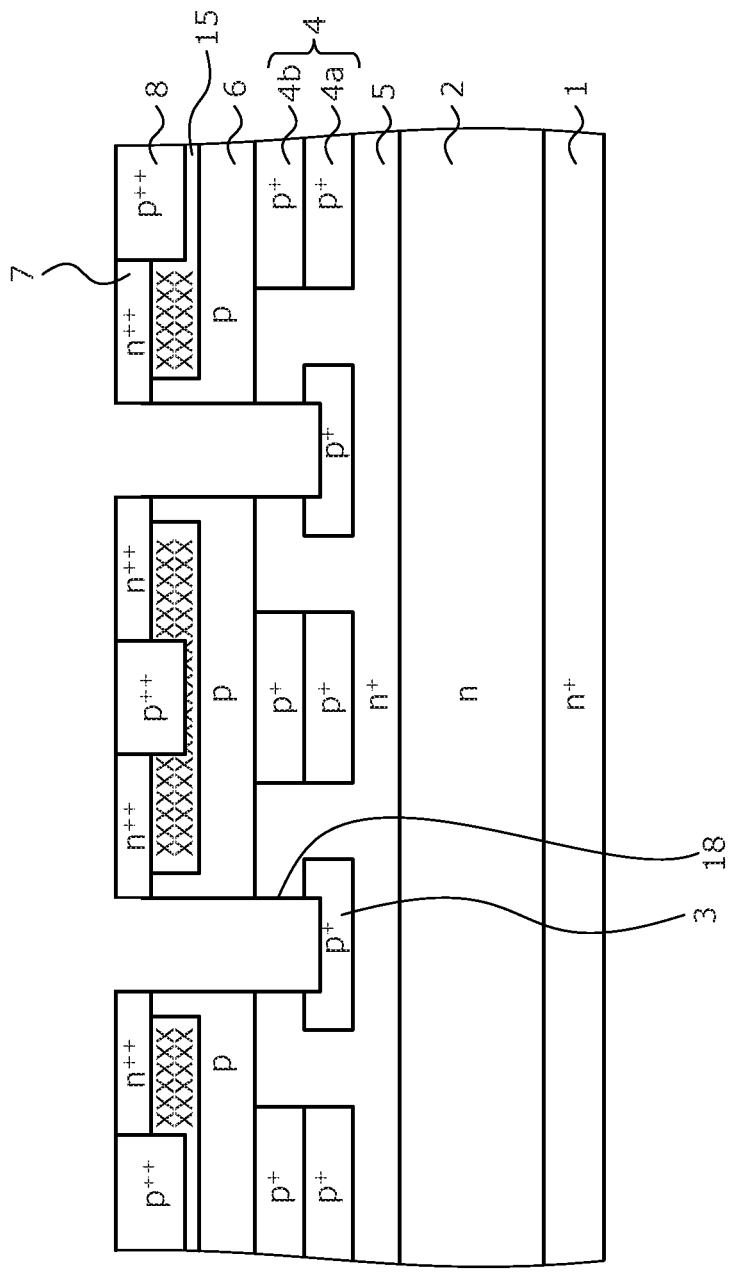
FIG. 8 is a cross-sectional view of the silicon carbide semiconductor device according to the first embodiment during manufacture.

Next, by photolithography and etching, the trenches 18 are formed penetrating the n++-type source regions 7 and the p-type epitaxial layer 6, and reaching the p+-type regions 3 in the n+-type drift region 5. An oxide film is used as a mask at the time of trench formation. Further, after trench etching, isotropic etching for removing damage of the trenches 18 and hydrogen annealing for rounding the bottoms of the trenches 18 and openings of the trenches 18 may be performed. Any one among the isotropic etching and the hydrogen annealing may be performed alone. Further, the hydrogen annealing may be performed after the isotropic etching is performed. The state up to here is depicted in FIG. 8.

Next, along the front surface of the silicon carbide base 100 and along inner walls of the trenches 18, the gate insulating film 9 is formed. Next, for example, poly-silicon is deposited so as to be embedded in the trenches 18 and is etched so that the poly-silicon in the trenches 18 remains, forming the gate electrode 10. At this time, etching may be performed so as to leave the poly-silicon farther inward than a base surface part, or the poly-silicon may protrude farther outward than the base surface part by performing patterning and etching.

Next, the interlayer insulating film 11 is formed on the front surface of the silicon carbide base 100 overall so as to cover the gate electrodes 10. The interlayer insulating film 11 is formed using, for example, a non-doped silicate glass (NSG), a phosphosilicate glass (PSG), a borophosphosilicate glass (BPSG), a high temperature oxide (HTO), or a combination thereof. Next, the interlayer insulating film 11 and the gate insulating film 9 are patterned and contact holes are formed, exposing the n++-type source regions 7 and the p++-type contact regions 8.

Next, the barrier metal 12 is formed so as to cover the interlayer insulating film 11 and is pattered to again expose the n++-type source regions 7 and the p++-type contact regions 8. Next, the source electrode 13 is formed so as to contact the n++-type source regions 7. The source electrode 13 may be formed so as to cover the barrier metal 12 or may be left only in the contact holes.

Next, the source electrode pad 14 is formed so as to be embedded in the contact holes. A portion of a metal layer deposited to form the source electrode pad 14 may be used as a gate pad. At the rear surface of the n+-type silicon carbide substrate 1, a metal film such as a nickel (Ni) film, a titanium (Ti) film, etc. is formed at a contact part of the drain electrode 16 by sputtering deposition. The metal film may be constituted by a stacked combination of a Ni film(s) and a Ti film(s). Thereafter, annealing such as rapid thermal annealing (RTA) is performed so as to convert the metal film into a silicide and form an ohmic contact. Thereafter, for example, a thick film constituted by a Ti film, a Ni film, and a gold (Au) film stacked in order stated is formed by electron beam (EB) deposition, etc., whereby the drain electrode 16 is formed.

In the epitaxial growth and ion implantations described, as an n-type impurity (n-type dopant), for example, nitrogen (N), phosphorus (P), arsenic (As), antimony (Sb), etc., which are n-types with respect to silicon carbide is used; and as a p-type impurity (p-type dopant), for example, boron (B), aluminum (Al), gallium (Ga), indium (In), thallium (Tl), etc., which are p-types with respect to silicon carbide is used. In this manner, the MOSFET depicted in FIG. 1 is completed.

As described, according to the first embodiment, in a p-type epitaxial layer formed by epitaxial growth, the lifetime killer region is provided by ion implantation, whereby a region is formed in electrons recombine and become extinct. Due to the lifetime killer region, electrons generated at the pn interface of the p-type epitaxial layer and the n-type drift layer decrease, enabling a configuration in which electrons are not delivered to the surface of the p-type epitaxial layer. Therefore, generation of stacking faults at the surface of the p-type epitaxial layer may be prevented, enabling increases in forward voltage of the silicon carbide semiconductor device to be prevented.

Further, according to the first embodiment, the lifetime killer region is provided separated from the trenches, whereby shape defects of the trenches due to variations in the etching rate and the oxidation rate at the time of formation of the lifetime killer region may be prevented.

Figure 9:
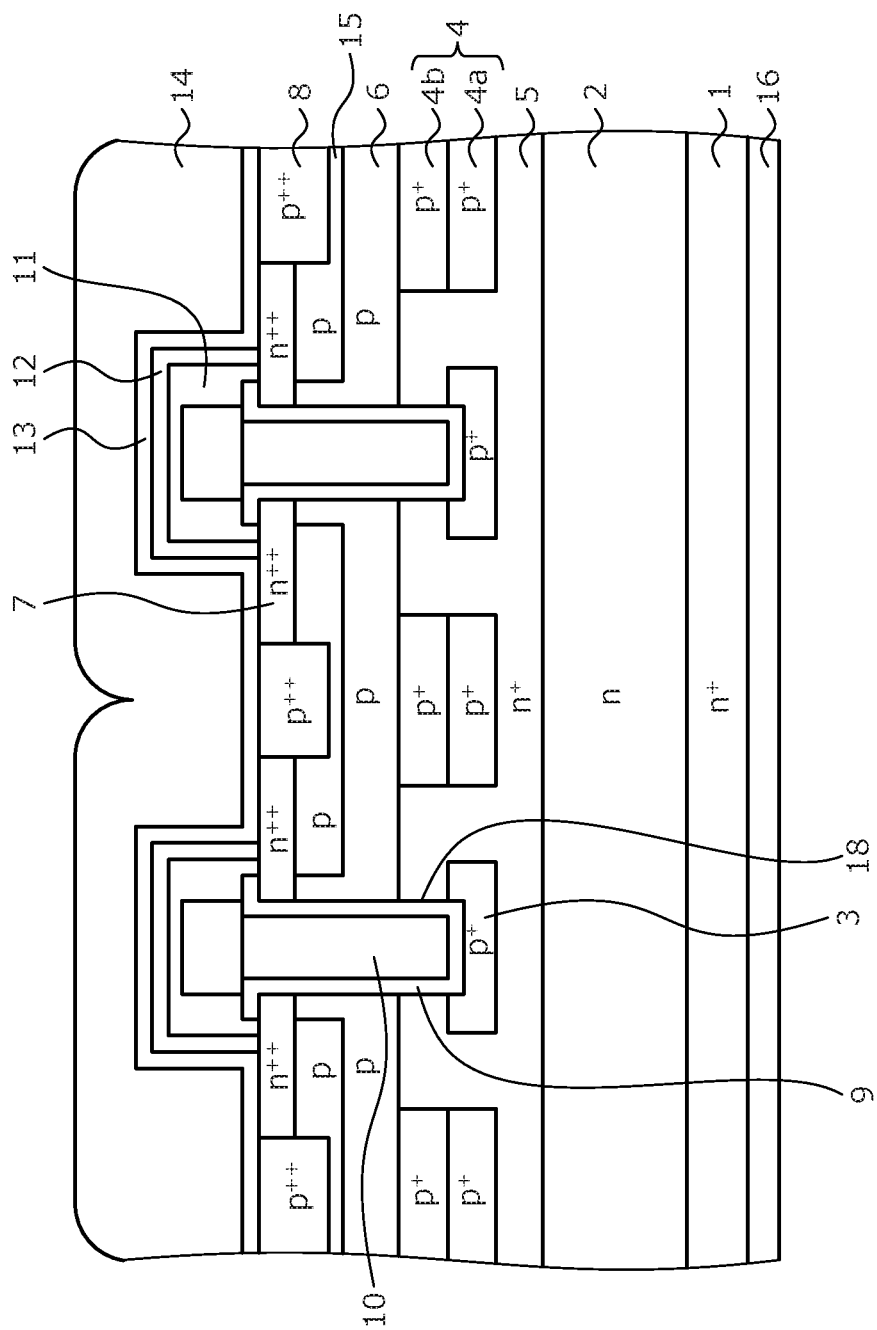
FIG. 9 is a cross-sectional view of a structure of the silicon carbide semiconductor device according to a second embodiment.

A structure of the silicon carbide semiconductor device according to a second embodiment will be described. FIG. 9 is a cross-sectional view of a structure of the silicon carbide semiconductor device according to the second embodiment. The silicon carbide semiconductor device according to the second embodiment differs from the silicon carbide semiconductor device according to the first embodiment in that an element that creates a deep energy level in the lifetime killer regions 15 is ion implanted.

Here, the deep energy level is an energy level positioned separated from an end of a valance band or conduction band, i.e., about in a middle of a forbidden band. The element that creates the deep energy level is, more specifically, boron (B), nitrogen (N), vanadium (V), titanium (Ti), iron (Fe), nickel (Ni), and chromium (Cr). The element that creates the deep energy level becomes an electron lifetime killer, and causes electrons that enter the lifetime killer regions 15 to recombine and become extinct.

When the lifetime killer regions 15 are formed by ion implantation of the element that creates the deep energy level element, an implantation concentration of the element that creates the deep energy level may be $3 \times 10^{13}$ to $3 \times 10^{20}/$cm$^3$. When the implantation concentration of the element that creates the deep energy level is lower than $3 \times 10^{13}/$cm$^3$, the electron density cannot be sufficiently attenuated, and electrons are delivered to the surface of the p-type epitaxial layer 6. Further, when the implantation concentration of the element that creates the deep energy level is higher than $3 \times 10^{20}/$cm$^3$, a depletion layer spreads in the p-type epitaxial layer 6, whereby breakdown voltage between the drain and the source may decrease and leak current between the drain and the source may increase.

Figure 10:
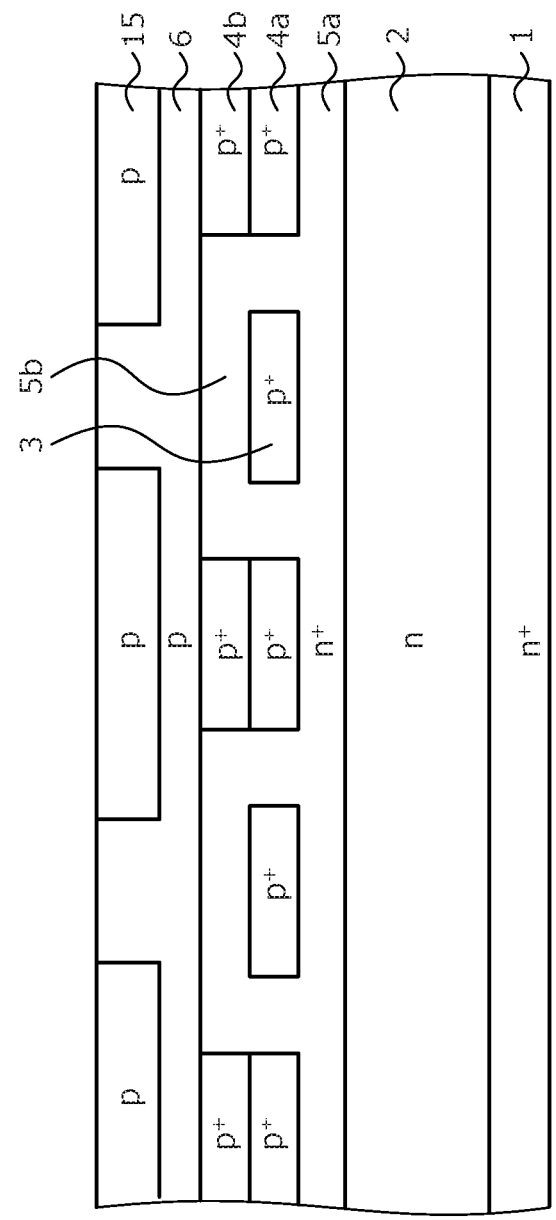
FIG. 10 is a cross-sectional view of the silicon carbide semiconductor device according to the second embodiment during manufacture.

A method of manufacturing the silicon carbide semiconductor device according to the second embodiment will be described. FIG. 10 is a cross-sectional view of the silicon carbide semiconductor device according to the second embodiment during manufacture. First, similarly to the first embodiment, processes of preparing the n+-type silicon carbide substrate 1 to forming the p-type epitaxial layer 6 are sequentially performed (refer to FIGS. 2 to 5).

Next, by photolithography and ion implantation, the lifetime killer regions 15 are formed in the surface layer of the p-type epitaxial layer 6 by ion implantation of the element that creates the deep energy level. The state up to here is depicted in FIG. 10. Thereafter, similarly to the first embodiment, the process of forming the n++-type source region 7 and subsequent processes are sequentially performed (refer to FIGS. 7, 8), whereby the MOSFET depicted in FIG. 9 is completed.

As described, according to the second embodiment, effects similar to those of the first embodiment may be obtained.

Figure 11:
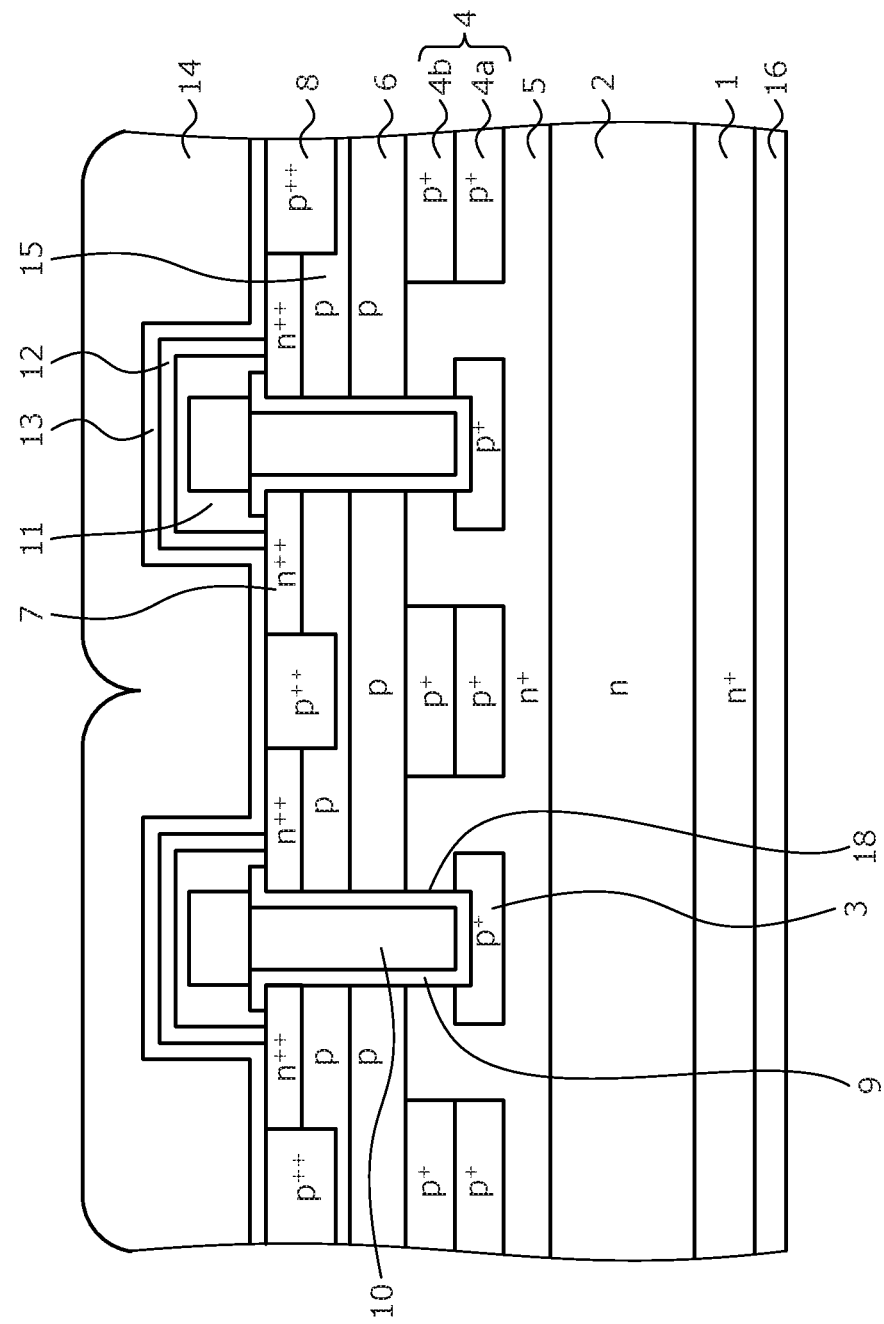
FIG. 11 is a cross-sectional view of a structure of the silicon carbide semiconductor device according to a third embodiment.

A structure of the silicon carbide semiconductor device according to a third embodiment will be described. FIG. 11 is a cross-sectional view of a structure of the silicon carbide semiconductor device according to the third embodiment. The silicon carbide semiconductor device according to the third embodiment differs from the silicon carbide semiconductor device according to the second embodiment in that the lifetime killer regions 15 are in contact with the trenches 18.

In the third embodiment, the lifetime killer regions 15 are formed by epitaxial growth while the element that creates the deep energy level is doped.

Further, the lifetime killer regions 15 may have a film thickness of 0.05 to 1.5 μm. When the film thickness is thinner than 0.05 μm, the electron density cannot be sufficiently attenuated, and electrons are delivered to the surface of the p-type epitaxial layer 6. Further, when the film thickness is thicker than 1.5 μm, roughness (unevenness) of the surface of the p-type epitaxial layer 6 increases and crystal defects increase.

Further, an implantation concentration of the element that creates the deep energy level may be $3 \times 10^{13}$ to $5 \times 10^{19}/cm^3$. When the implantation concentration the element that creates the deep energy level is less than $3 \times 10^{13}/cm^3$, the electron density cannot be sufficiently attenuated, and electrons are delivered to the surface of the p-type epitaxial layer 6. Further, when the implantation concentration of the element that creates the deep energy level is higher than $5 \times 10^{19}/cm^3$, roughness of the surface of the p-type epitaxial layer 6 increases, and crystal defects increase. Further, due to the spreading of a depletion layer in the p-type epitaxial layer 6, breakdown voltage between the drain and the source may decrease and leak current between the drain and the source may increase.

Figure 12:
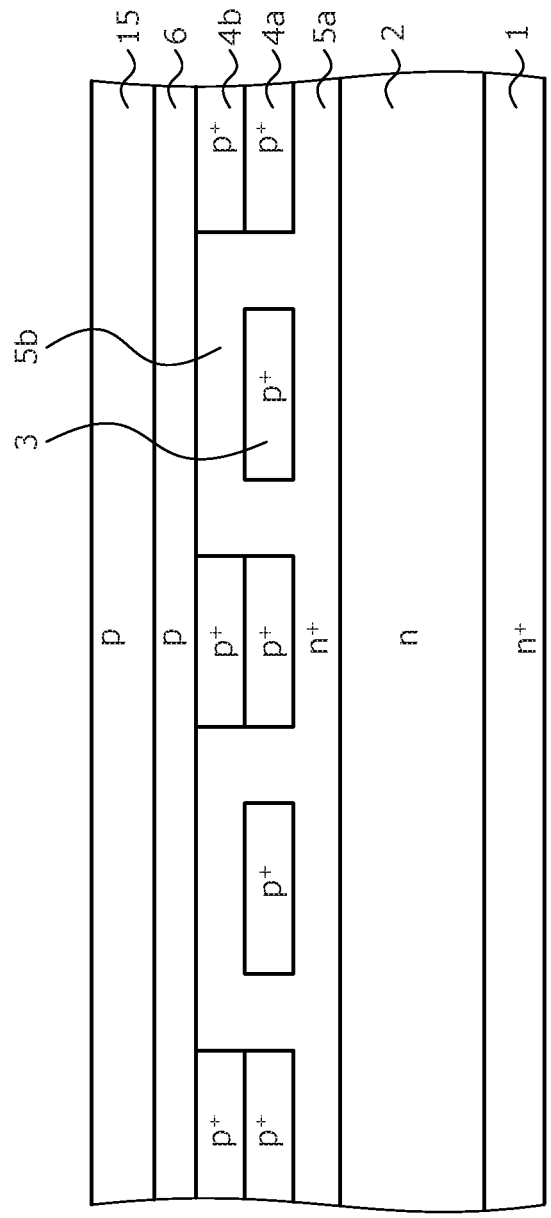
FIG. 12 is a cross-sectional view of the silicon carbide semiconductor device according to the third embodiment during manufacture.
Figure 13:
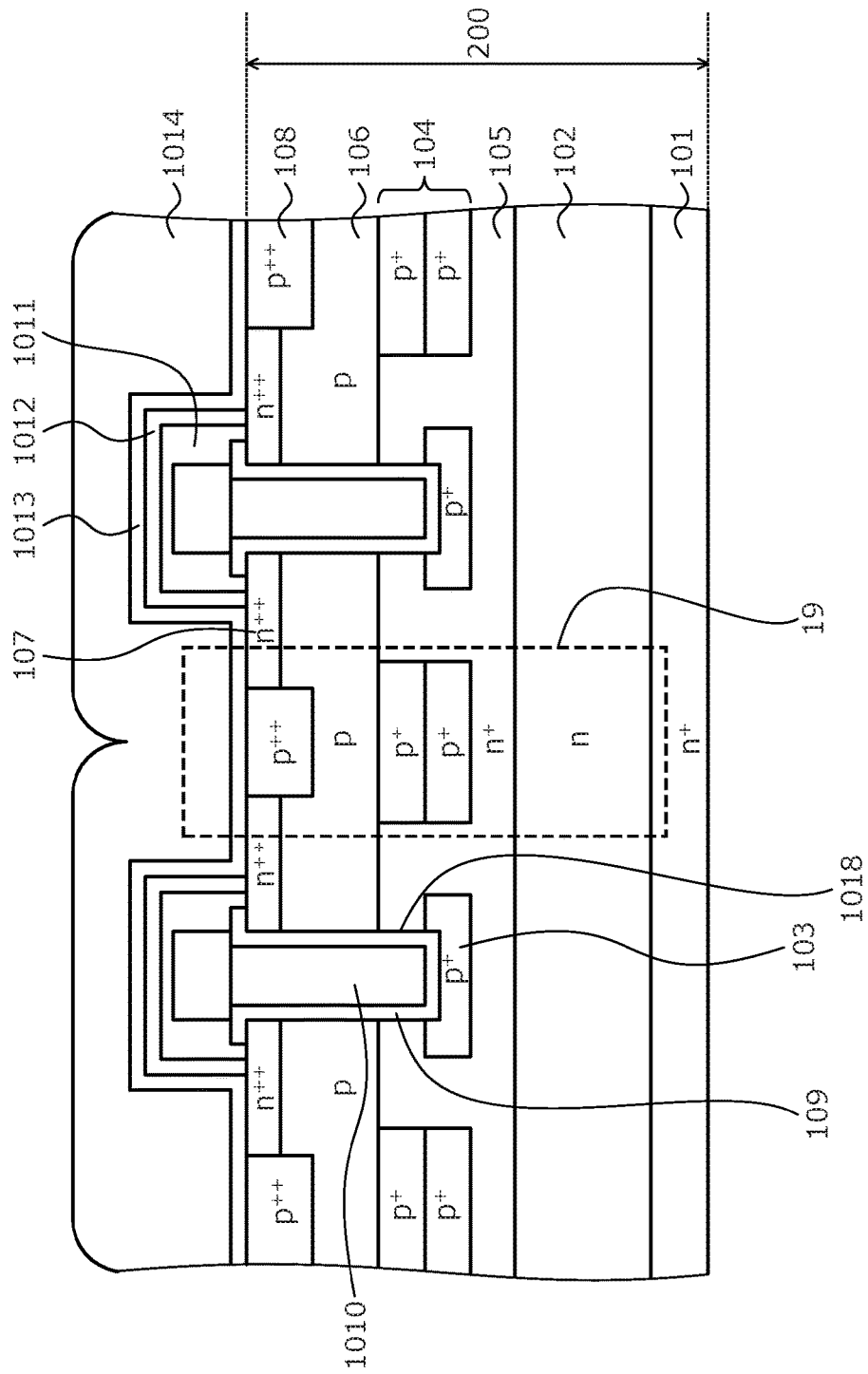
FIG. 13 is a cross-sectional view of a structure of a conventional silicon carbide semiconductor device.

A method of manufacturing the silicon carbide semiconductor device according to the third embodiment will be described. FIG. 12 is a cross-sectional view of the silicon carbide semiconductor device according to the third embodiment during manufacture. First, similarly to the first embodiment, processes of preparing the n$^+$-type silicon carbide substrate 1 to forming the upper p$^+$-type base regions 4b are sequentially performed (refer to FIGS. 2 to 4).

Next, on the second n$^+$-type drift region 5b and the upper p$^+$-type base regions 4b, the p-type epitaxial layer 6 is formed by epitaxial growth while a p-type impurity is doped. After the p-type epitaxial layer 6 is grown to a predetermined thickness, the lifetime killer regions 15 are formed by epitaxial growth while a p-type impurity and the element that creates the deep energy level are doped. The state up to here is depicted in FIG. 12. Thereafter, similarly to the first embodiment, the process of forming the n$^{++}$-type source regions 7 and subsequent processes are sequentially performed (refer to FIGS. 7, 8), whereby the MOSFET depicted in FIG. 11 is completed.

As described, according to the third embodiment, effects similar to those of the first embodiment may be obtained.

In the embodiments of the present invention, various modifications within a range not departing from the spirit of the invention are possible. For example, dimensions, impurity concentrations, etc. of regions may be set according to required specifications. Further, although a MOSFET is described as an example in the embodiments, without limitation hereto, application is possible to many types of silicon carbide semiconductor devices that conduct and interrupt current under gate driving control based on a predetermined gate threshold voltage. For example, an insulated gate bipolar transistor (IGBT), etc. may be given as an example of a silicon carbide semiconductor device under gate driving control. Further, in the embodiments, while a case in which silicon carbide is used as a wide bandgap semiconductor material is described as an example, other than silicon carbide, for example, a wide bandgap semiconductor material such as gallium nitride (GaN) may be used. In the embodiments, although a first conductivity type is assumed to be an n-type and a second conductivity type is assumed to be a p-type, the present invention is similarly implemented when the first conductivity type is a p-type and the second conductivity type is an n-type.

According to the embodiments of the present invention, the lifetime killer region (first semiconductor region of the second conductivity type) is provided by ion implantation in the p-type epitaxial layer (second semiconductor layer of the second conductivity type) formed by epitaxial growth, whereby a region is formed that causes electrons to recombine and become extinct. Due to lifetime killer region, electrons generated at the pn interface of the p-type epitaxial layer and the n-type drift layer (first semiconductor layer of the first conductivity type) decrease and enabling a configuration in which electrons are not delivered to the surface of the p-type epitaxial layer. Therefore, generation of stacking faults at the surface of the p-type epitaxial layer may be prevented, enabling increases in forward voltage of the silicon carbide semiconductor device to be prevented.

Further, provision of the lifetime killer region separated from the trenches, enables shape defects of the trenches due to variations in the etching rate and the oxidation rate at the time of formation of the lifetime killer region to be prevented.

The silicon carbide semiconductor device and the method of manufacturing a silicon carbide semiconductor device according to the embodiments of the present invention achieve an effect in that generation of stacking faults from the surface of the p-type epitaxial layer are prevented and increases in forward voltage due to the generation of stacking faults may be prevented.

As described, the silicon carbide semiconductor device and the method of manufacturing a silicon carbide semiconductor device according to the embodiments of the present invention are useful for power semiconductor devices used in power converting equipment and power supply devices such as in industrial machines and the like, and are particularly suitable for silicon carbide semiconductor devices having a trench gate structure.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A silicon carbide semiconductor device, comprising:
   a silicon carbide substrate;
   a first semiconductor layer of a first conductivity type that is provided on a front surface of the silicon carbide substrate;
   a second semiconductor layer of a second conductivity type that is provided on a first side of the first semiconductor layer opposite a second side of the first semiconductor layer which faces the silicon carbide substrate;
   a first semiconductor region of the second conductivity type that is selectively provided in the second semiconductor layer and that controls electron lifetime;

a second semiconductor region of the first conductivity type that is selectively provided in the second semiconductor layer at a position shallower than a position of the first semiconductor region and that has an impurity concentration that is higher than that of the silicon carbide substrate;

a third semiconductor region of the second conductivity type that is selectively provided in the second semiconductor layer at a position shallower than the position of the first semiconductor region and that has an impurity concentration that is higher than that of the second semiconductor layer;

a trench that penetrates the second semiconductor region and the second semiconductor layer and that reaches the first semiconductor layer;

a gate insulating film that is provided in the trench;

a gate electrode that is provided in the trench on the gate insulating film;

a first electrode that is disposed in contact with the second semiconductor region and the third semiconductor region; and a second electrode that is provided at a rear surface of the silicon carbide substrate.

2. The silicon carbide semiconductor device according to claim 1, wherein the first semiconductor region is separated from the trench.

3. The silicon carbide semiconductor device according to claim 1, wherein the first semiconductor region has crystal defects at a density higher than that of the second semiconductor layer.

4. The silicon carbide semiconductor device according to claim 1, wherein the first semiconductor region is a region implanted with an element that creates an energy level that is a deep energy level.

5. A method of manufacturing a silicon carbide semiconductor device, comprising:

providing a silicon carbide substrate;

forming a first semiconductor layer of a first conductivity type on a front surface of the silicon carbide substrate;

forming a second semiconductor layer of a second conductivity type on the first semiconductor layer;

selectively forming a first semiconductor region of the second conductivity type in the second semiconductor layer, the first semiconductor region controlling electron lifetime;

selectively forming a second semiconductor region of the first conductivity type in the second semiconductor layer at a position that is shallower than that of the first semiconductor region, the second semiconductor region having an impurity concentration that is higher than that of the silicon carbide substrate;

selectively forming a third semiconductor region of the second conductivity type in the second semiconductor layer at a position shallower than that of the first semiconductor region, the third semiconductor region having an impurity concentration that is higher than that of the second semiconductor layer;

forming a trench that penetrates the second semiconductor region and the second semiconductor layer and reaches the first semiconductor layer;

forming a gate insulating film in the trench;

forming a gate electrode in the trench on the gate insulating film;

forming a first electrode in contact with the second semiconductor region and the third semiconductor region; and forming a second electrode at a rear surface of the silicon carbide substrate.

6. The method according to claim 5, wherein selectively forming the first semiconductor region includes forming the first semiconductor region separated from the trench.

7. The method according to claim 5, wherein selectively forming the first semiconductor region includes forming the first semiconductor region to have a crystal defect density that is higher than that of the second semiconductor layer.

8. The method according to claim 5, wherein selectively forming the first semiconductor region includes forming the first semiconductor region by implanting an element that creates an energy level that is a deep energy level.

* * * * *